United States Patent
Kahmen et al.

(10) Patent No.: US 9,177,946 B2
(45) Date of Patent: Nov. 3, 2015

(54) SEMICONDUCTOR CIRCUIT WITH ELECTRICAL CONNECTIONS HAVING MULTIPLE SIGNAL OR POTENTIAL ASSIGNMENTS

(71) Applicant: Rohde & Schwarz GmbH & Co. KG, Munich (DE)

(72) Inventors: Gerhard Kahmen, Oberhaching (DE); Thomas Dabrowski, Duesseldorf (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/343,873

(22) PCT Filed: Feb. 19, 2013

(86) PCT No.: PCT/EP2013/053277
§ 371 (c)(1),
(2) Date: Mar. 10, 2014

(87) PCT Pub. No.: WO2013/131742
PCT Pub. Date: Sep. 12, 2013

(65) Prior Publication Data
US 2014/0225664 A1  Aug. 14, 2014

(30) Foreign Application Priority Data

Mar. 8, 2012 (DE) .................... 20 2012 002 379 U
May 7, 2012 (DE) .................... 20 2012 004 532 U

(51) Int. Cl.
H01L 23/48 (2006.01)
H01L 23/52 (2006.01)
H03B 1/00 (2006.01)
H03K 5/00 (2006.01)
H04B 1/10 (2006.01)
(Continued)

(52) U.S. Cl.
CPC ............ *H01L 27/0203* (2013.01); *H01L 23/50* (2013.01); *H03K 19/0016* (2013.01); *H03K 19/1732* (2013.01); *H01L 2224/48247* (2013.01); *H01L 2224/48257* (2013.01); *H01L 2224/49431* (2013.01); *H01L 2924/1305* (2013.01)

(58) Field of Classification Search
CPC .................................... H01L 27/0203
USPC .......................... 257/690; 327/566
See application file for complete search history.

(56) References Cited

U.S. PATENT DOCUMENTS 5,412,333 A  5/1995  Okunaga
5,646,451 A  7/1997  Freyman et al.
(Continued)

OTHER PUBLICATIONS

International Preliminary Report on Patentability and Written Opinion issued in corresponding application No. PCT/EP2013/053277 on Sep. 9, 2014.
(Continued)

*Primary Examiner* — David S Blum
(74) *Attorney, Agent, or Firm* — Carter, DeLuca, Farrell & Schmidt, LLP

(57) ABSTRACT

A semiconductor circuit provides at least one first electrical pin with multiple signal assignment or potential assignment in order to integrate several circuit variants in the semiconductor circuit. It has a switch element for isolating or connecting at least one first electrical pin from or to an input or output of a functional unit integrated in the semiconductor circuit.

11 Claims, 4 Drawing Sheets

Figure 1:
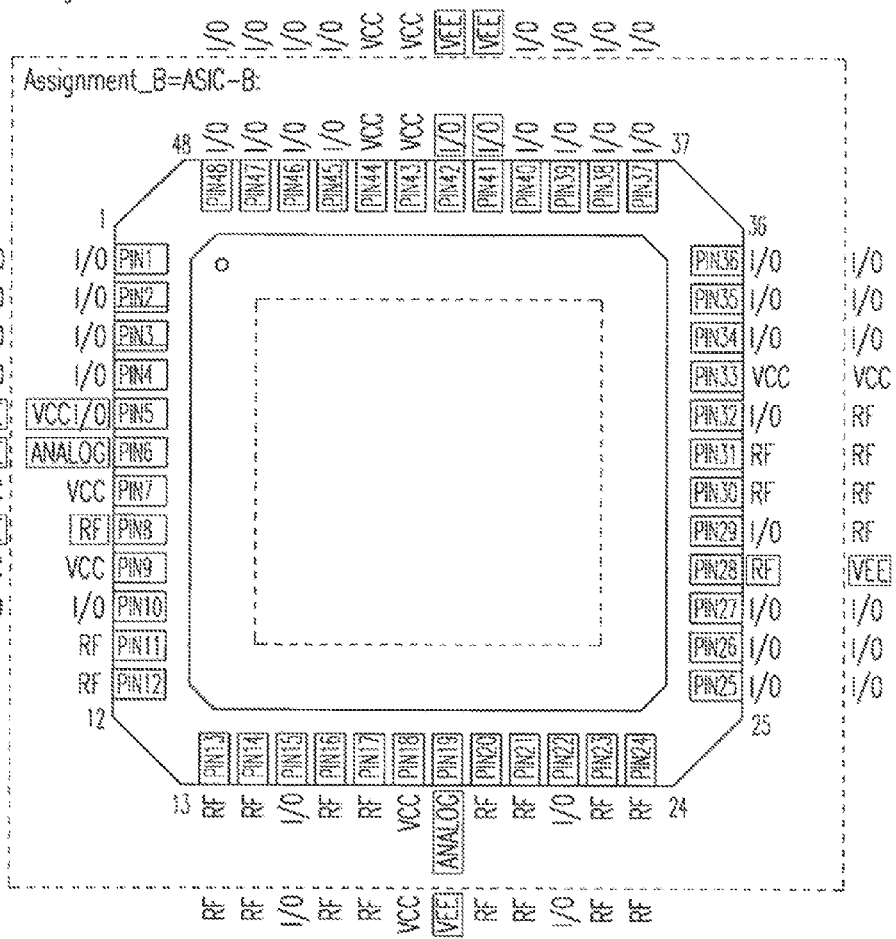

(51) Int. Cl.
*H01L 27/02* (2006.01)
*H01L 23/50* (2006.01)
*H03K 19/00* (2006.01)
*H03K 19/173* (2006.01)

(56) References Cited

U.S. PATENT DOCUMENTS

| | | |
|---|---|---|
| 6,127,883 A | 10/2000 | Mori et al. |
| 6,385,756 B1 | 5/2002 | Braun |
| 6,992,940 B1 | 1/2006 | Tauber |
| 2003/0141578 A1 | 7/2003 | Corisis |
| 2006/0055391 A1 | 3/2006 | Kuang et al. |
| 2009/0045677 A1 | 2/2009 | Frey et al. |
| 2009/0051406 A1 | 2/2009 | Kawasaki |

OTHER PUBLICATIONS

International Search Report issued in corresponding application No. PCT/EP2013/053277 mailed May 16, 2013.

SEMICONDUCTOR CIRCUIT WITH ELECTRICAL CONNECTIONS HAVING MULTIPLE SIGNAL OR POTENTIAL ASSIGNMENTS

The invention relates to a semiconductor circuit with electrical pins with multiple signal assignment or potential assignment.

In hardware development, it is conventional to generate successor circuit variants (circuit generations, versions) of integrated semiconductor circuits in subsequent development processes, in each case on the basis of an integrated semiconductor circuit developed in an initial development process. These successor circuit variants of integrated semiconductor circuits conventionally provide an expanded functional scope and improved performance properties. In particular, the expanded functional scope requires a larger number of electrical pins (pins).

In order to minimise unit costs for the integrated semiconductor circuits as far as possible, a successor circuit variant of an integrated semiconductor circuit contains the functional scope and performance properties of all precursor circuit variants and is integrated in an identical housing with an identical number and an identical arrangement of electrical pins. In this manner, each successor circuit variant of an integrated semiconductor circuit is structured to be compatible with each of its precursor circuit variants and can replace the latter in a retrofitting process without modifying the external configuration and without the use of additional wiring.

Expanding the functional scope of successor circuit variants typically requires a functionally modified pinout or a larger number of electrical pins by comparison with the respective precursor embodiments.

It is known from US 2003/0141578 A1 that a set of internal electrical pins can be provided, in this case on the chip surface of the semiconductor circuit respectively for each circuit variant. In the final assembly of the semiconductor circuit, the electrical pins of the circuit variant of the semiconductor circuit utilised by each user are connected in each case via a bonding wire to the electrical pins of the housing of the semiconductor circuit. Such a technical realisation with several circuit-dependent and function-dependent bonding variants leads to an increase in the chip area. The different wiring of the individual circuit variants of the semiconductor circuit requires a marking dependent upon the selected circuit variant which increases the manufacturing costs. Under some circumstances, the implementation of multiple sets of internal electrical pins on the chip surface of the semiconductor circuit requires different testing configurations, which additionally increase the costs for testing. Finally, an increase in logistics costs must also be taken into account, because a quantity of part numbers corresponding to the quantity of circuit variants is required respectively for every semiconductor circuit.

The object of the invention is therefore to develop a semiconductor circuit in which the functional scope of each of the precursor circuit variants is also implemented, and the cost for the connection between the electrical pins of the functional units associated respectively with the individual circuit variants and the electrical pins of the housing is minimised.

The invention is achieved by a semiconductor circuit with the features of claim 1. Advantageous technical developments are specified in the respectively dependent claims.

According to the invention, several electrical pins of the semiconductor circuit—referred to below as first electrical pins of the semiconductor circuit—are provided with a multiple assignment of a signal and/or a potential for every one of the circuit variants of the semiconductor circuit. In this manner, multiple bonding variants are no longer required.

In order to connect the signal assignment or potential assignment of the individual first electrical pins of the semiconductor circuit correctly to the associated inputs or outputs of the functional units of the circuit variant of the semiconductor circuit utilised by the user, switch elements are provided in the semiconductor circuit which connects the first electrical pins to the inputs or outputs of the functional units respectively associated with the circuit variant in use or respectively isolates them from the inputs or outputs of the functional units respectively associated with the circuit variants not in use.

Additionally, such a device according to the invention preferably provides a selection unit, which controls the individual switch elements dependent upon the circuit variants of the semiconductor circuit used. For this purpose, the potential levels of at least one electrical pin of the semiconductor circuit—referred to below as the second electrical pins of the semiconductor circuit—are evaluated by the selection unit.

Because of the multiple assignment of the first electrical pins of the semiconductor circuit, every first electrical pin is connected with a number of switch elements corresponding to the number of signal assignments or potential assignments of the respective first electrical pin to the input or output allocated to the respective first electrical pin of the functional units respectively associated with the individual circuit variants.

Conversely, under some circumstances, the multiple assignment of first electrical pins of the semiconductor circuit requires that an input or output of a functional unit or of several functional units which is isolated from a first electrical pin in one circuit variant of the semiconductor circuit because of a blocked switch element is connected to another first electrical pin of the semiconductor circuit via another conductive switch element.

In a preferred first variant of the invention, the control of the individual switch elements via the selection unit is implemented on the basis of the potential level disposed at a single second electrical pin of the semiconductor circuit. In this context, the number of the potential levels to be distinguished by the selection unit corresponds to the number of circuit variants realised in the semiconductor circuit.

In a preferred second variant of the invention, the control of the individual switch elements is implemented by the selection unit by evaluating both potential levels of several second electrical pins.

In order to minimise or reduce to zero the number of second electrical pins of the semiconductor circuit which are not available as electrical pins for the actual technical function of the circuit variants selected in the semiconductor circuit, the electrical pins of the semiconductor circuit, through which the supply voltage or the release signal of a functional unit is conducted, are preferably used as second electrical pins.

By preference, field-effect transistors which provide a comparatively high forward resistance in the blocked state and accordingly achieve an optimal and approximately galvanic isolation between the respective first electrical pin and the associated inputs or outputs of the functional units connected to the respective first electrical pin are used as switch elements.

While the first electrical pins of the semiconductor circuit in a first preferred embodiment of the invention correspond to the electrical pins arranged on the housing of the semiconductor circuit, a first electrical pin of the semiconductor circuit in the second preferred embodiment of the invention is also realised as a wire bridge to an electrically conductive pad, which is disposed in a direct connection with the semiconductor circuit and provides a defined electrical potential. The electrically conductive pad with defined electrical potential is preferably an electrically conductive pad disposed above or below the housing of the semiconductor circuit with a potential identical to a reference potential of the semiconductor circuit.

This can be an exposed pad (so-called exposed Pad (ePad)) projecting beyond the housing of the semiconductor circuit and disposed at the ground potential of the semiconductor circuit. However, as an alternative, a pad projecting beyond the housing of the semiconductor circuit and disposed at a positive or negative reference potential of the semiconductor circuit is also possible.

Figure 2:
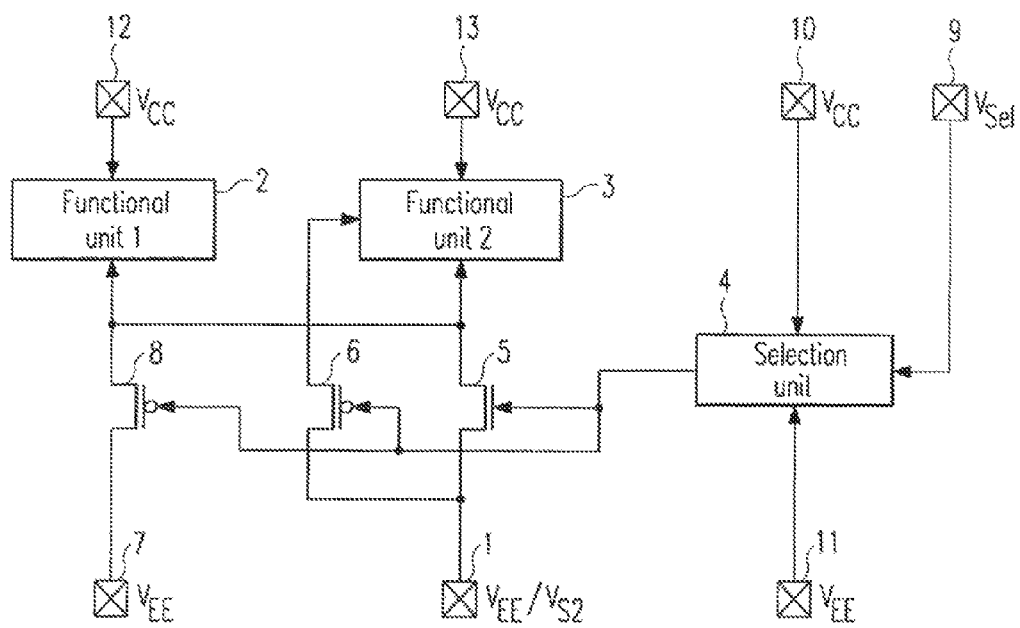
Figure 3A:
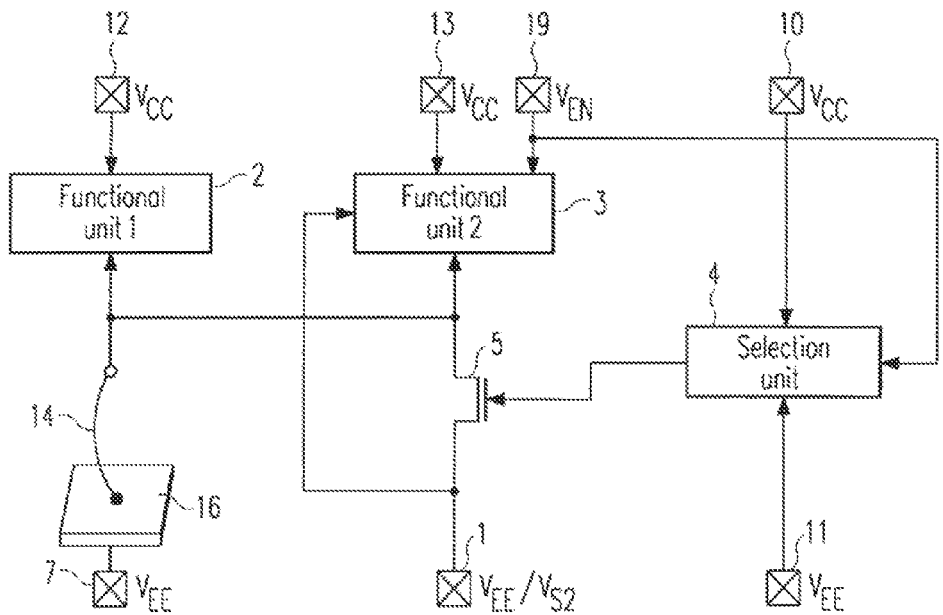
Figure 3B:
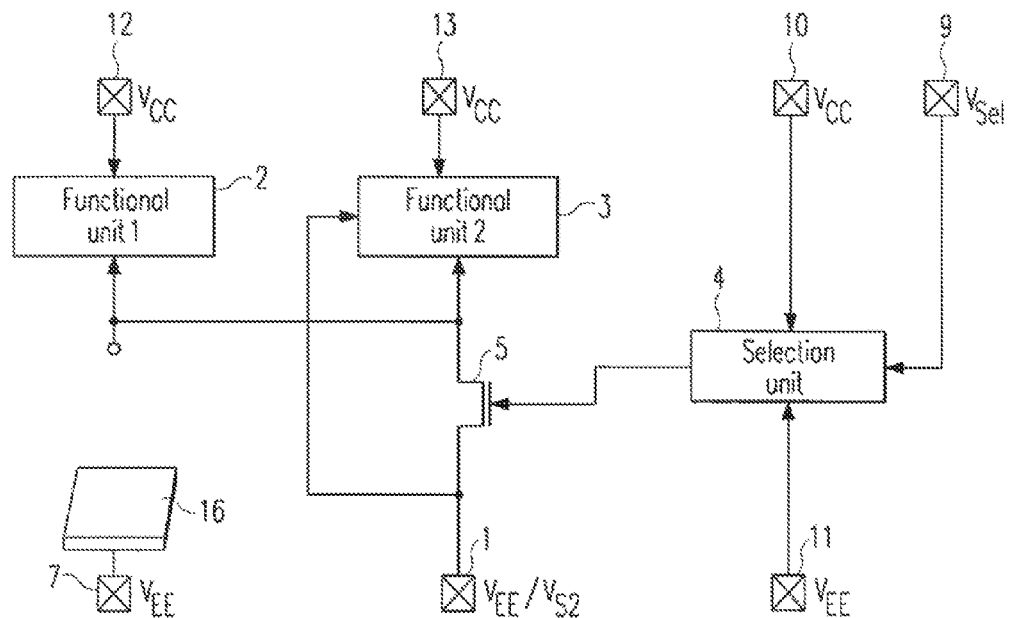
Figure 4:
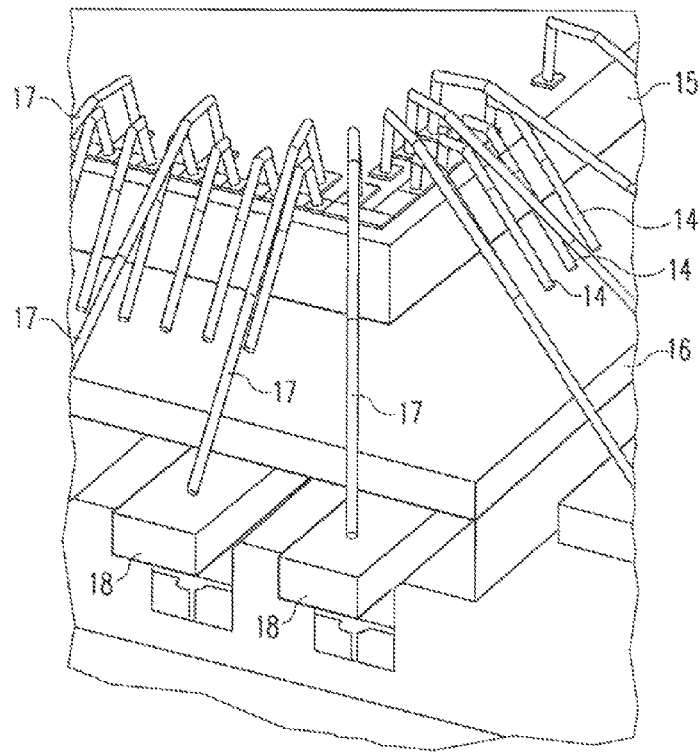
Figure 5:
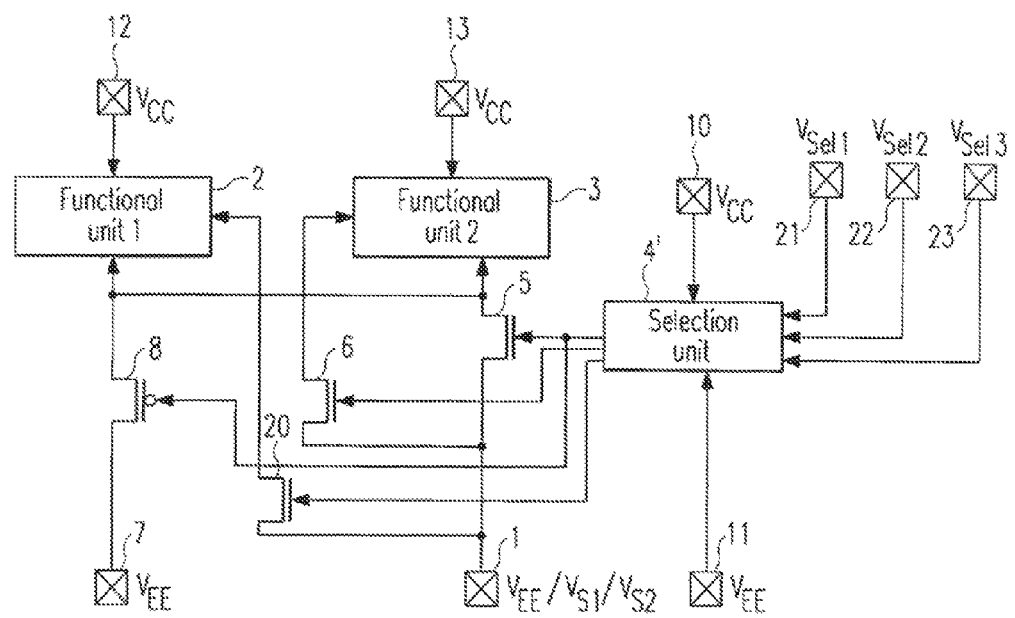

With reference to the drawings, exemplary embodiments of the semiconductor circuit according to the invention are explained in detail below by way of example. The figures in the drawings show:

FIG. 1 an exemplary view of the signal assignment or potential assignment of the individual electrical pins for two circuit variants of the semiconductor circuit;

FIG. 2 a block-circuit diagram of a first embodiment of a semiconductor circuit according to the invention;

FIG. 3A a block-circuit diagram of a second embodiment with a first circuit variant of a semiconductor circuit according to the invention;

FIG. 3B a block-circuit diagram of a second embodiment with a second circuit variant of a semiconductor circuit according to the invention;

FIG. 4 a three-dimensional exemplary view of an ePad connected to a semiconductor chip via wire bridges; and FIG. 5 a block-circuit diagram of a third embodiment of a semiconductor circuit according to the invention.

FIG. 1 shows the housing of a semiconductor circuit, for example, an ASIC, with a total of 48 electrical pins. While the assignment (Assignment_A) of the 48 electrical pins with signals or potentials for a first circuit variant (ASIC-A) is evident on the outside, the assignment (Assignment_B) of the 48 electrical pins with signals or potentials for a second circuit variant (ASIC-B) is shown on the inside. Conventional abbreviations for the assignments of the individual electrical pins are used (I/O: binary input/output signal; RF: high-frequency input/output signal; ANALOG: analog input/output signal; VCC: positive reference potential; VEE: ground potential).

In the case of an assignment according to the invention (Assignment_C) of the 48 electrical pins, which combines the assignment (Assignment_A) of the first circuit variant (ASIC-A) and the assignment (Assignment_B) of the second circuit variant (ASIC-B), certain electrical pins in FIG. 1 (with the assignment reference shown within a border) are provided with a double assignment. Semiconductor circuits with any other number of electrical pins and with any other number of multiple assignments of an electrical pin or of several electrical pins are naturally also covered by the invention.

In order to integrate two circuit variants in a single semiconductor circuit with a multiple assignment according to the invention of one or more electrical pins and accordingly to avoid multiple bonding variants, the following technical precautions must be fulfilled in a first embodiment of a semiconductor circuit according to the invention as specified in FIG. 2.

For the sake of simplicity, the case of a double assignment of the first electrical pin 1 with the ground potential $V_{EE}$ and the binary input/output signal $V_{S2}$ in the first embodiment of a semiconductor circuit according to the invention as illustrated in FIG. 2 is treated in a schematic manner. Of course, a first electrical pin 1 can also be assigned in parallel with other types of signals and potentials and this is also covered by the invention.

While the ground potential $V_{EE}$ in a first circuit variant of the semiconductor circuit serves to supply the first functional unit 2 and the second functional unit 3 with the ground reference potential at the same time, the binary input/output signal $V_{S2}$ in a second circuit variant of the semiconductor circuit is transferred exclusively between the input/output unit, exclusively to the second functional unit 3 and to the first electrical pin 1.

In a first circuit variant of the semiconductor circuit, if the ground potential $V_{EE}$ disposed at the first electrical pin 1 is conducted to the corresponding ground pin of the first functional unit 2 and of the second functional unit 3 in order to connect the first electrical pin 1 to the ground pin of a first functional unit 2 and a second functional unit 3, a switch element 5 disposed in the signal path between the first electrical pin 1 and the two ground pins of the first functional unit 2 and the second functional unit 3, which is realised as a field effect transistor in the exemplary embodiment, is transferred via a control signal generated by the selection unit 4 into the conductive state.

At the same time, in order to isolate the first electrical pin 1 with the input/output pin of the second functional unit 3 in the first circuit variant of the semiconductor circuit, a switch element 6 disposed in the signal path between the first electrical pin 1 and the input/output pin of the second functional unit 3, which is also preferably realised as a field-effect transistor and provides a control logic inverse to the switch element 5, is transferred into the blocked state by the same control signal generated by the selection unit 4. This prevents the ground potential disposed at the first electrical pin 1 from being conducted to the input/output pin of the second functional unit 3 and, under some circumstances, leading to an error function of the second functional unit 3.

As illustrated in FIGS. 3A and 3B, the interconnection of the switch element 6 in the signal path between the first electrical pin 1 and the input/output pin of the second functional unit 3 is not absolutely necessary, because input/output pins of functional units typically provide a de-coupling unit for isolation. By contrast, if the first electrical pin were connected via the switch element 6 to a potential pin of the second functional unit 3 different from the ground potential, this potential pin would have to be kept at the required potential level throughout the entire operating time of the semiconductor circuit and would therefore require the interconnection of a blocked switch element 6 in order to prevent a connection of the first electrical pin 1 disposed at ground potential to the potential pin of the second functional unit 3.

In the second circuit variant of the semiconductor circuit, in order to isolate the first electrical pin 1 from the ground pins of the first functional unit 2 and the second functional unit 3, the switch element 5 in the signal path between the first electrical pin 1 and the ground pin of the first functional unit 2 and the second functional unit 3 is blocked via the inverted control signal generated by the selection unit 4, while, at the same time, the switch element 6 in the signal path between the first electrical pin 1 and the input/output pin of the second functional unit 3 is transferred into the conductive state in order to connect the first electrical pin to the input/output pin of the second functional unit 3.

At the same time, in order to supply the first functional unit 2 and the second functional unit 3 with a ground potential, a switch element 8 disposed in a signal path between a further first electrical pin 7 with ground potential and the ground pins of the first functional unit 2 and the second functional unit 3, which is also preferably realised as a field-effect transistor and provides a control logic inverse to the control logic of the switch element 5, is transferred into the conductive state via the same control signal generated by the selection unit 4.

In a first variant of the invention, which is also illustrated in FIG. 2, the generation of the control signal in the selection unit 4 in order to control the switch elements 5, 6 and 8 is implemented by evaluating the level of the potential $V_{Sel}$ disposed at a single second electrical pin 9.

In order to operate the selection unit 4, it is necessary to supply a typically positive reference potential $V_{CC}$ and a ground potential $V_{EE}$. As illustrated in FIG. 2, the positive reference potential $V_{CC}$ and the ground potential $V_{EE}$ can be drawn via additional first electrical pins 10 and 11 or, in order to save first electrical pins, can be realised via the first electrical pins 12 and 13 provided to supply the first functional unit 2 and the second functional unit 3 with a positive reference potential $V_{CC}$ and the first electrical pins 1 and 7 provided to supply the first functional unit 2 and the second functional unit 3 with a ground potential $V_{EE}$.

In a second embodiment of the invention, the supply of the first functional unit 2 and the second functional unit 3 with a ground potential in the case of a blocked switch element 5 in the signal path between the first electrical pin 1 and the ground pins of the first functional unit 2 and the second functional unit 3 is realised without interconnection of a switch element 8 via a wire bridge 14 to a pad 16 which is disposed at the ground potential of the semiconductor circuit, as specified in FIG. 3A. As shown in FIG. 4, this electrically conductive pad 16 is arranged on the underside of the semiconductor chip 15 (but can also be arranged on the upper side of the semiconductor chip 15) and projects beyond the semiconductor chip 15 and is accordingly exposed (so-called exposed Pad (ePad)). At least one wire bridge 14 which is connected to a contact on the semiconductor chip is arranged, especially bonded, to the exposed surface of the electrically conductive pad 16. The electrically conductive pad 16 is connected to a first electrical pin 7 of the semiconductor circuit which is disposed at ground potential. The semiconductor chip 15 is contacted via bonding wires 17 to the individual electrical pins 18 on the housing of the semiconductor circuit.

FIG. 3B shows the case in which no connection via a wire bridge 14 is present between the ground pins of the first functional unit 2 and the second functional unit 3 and the ground potential at a first electrical pin 7, and the ground pins of the first functional unit 2 and the second functional unit 3 are connected via the switch element 5 to the ground potential to the first electrical pin 1.

In the illustration of FIG. 3A, the control signal for the switch element 5 is determined from the level of the release signal $V_{EN}$ for the activation of the second functional unit 3 at an electrical pin 19. In this case, the requirement for an additional, second electrical pin 9, at which the potential $V_{Sel}$ to be evaluated is disposed, is advantageously not required.

In the third exemplary embodiment from FIG. 5, the first electrical pin 1 is assigned with three signals or potentials. Alongside the ground potential $V_{EE}$ for the ground supply of the first functional unit 2 and the second functional unit 3, the input/output signal $V_{S2}$, which is connected to an input/output pin of the second fusion unit 3, a further input/output signal $V_{S1}$ can also be applied, which is connected to an input/output pin of the first functional unit 2. In order to connect or isolate the first electrical pin to or from the input/output pin of the first functional unit 2, a further switch element 20 is connected in the signal path between the first electrical pin 1 and the input/output pin of the first functional unit 2.

In this technical embodiment, the control of the switch elements 5 or respectively 8, 6 and 20 is implemented in each case by three separate control signals, which are generated by a selection unit 4' for the three circuit variants of the semiconductor circuit. Additionally, in the second variant of the invention illustrated in FIG. 5, as in the case of the first variant of the invention illustrated in FIG. 3A, in order to control the individual switch elements, different signal levels or potential levels of a single signal or potential $V_{Sel}$ are not evaluated, but instead the signal levels or potential levels of several signals or potentials—in FIG. 5, the signals or potentials $V_{Sel1}$, $V_{Sel2}$ and $V_{Sel3}$ at the second electrical pins 21, 22 and 23—are evaluated in the selection unit 4'.

To achieve a practicable design of the line cross sections of the individual lines in the semiconductor circuit and a practicable dimensioning of the individual field-effect transistors acting as switch elements 5, 6, 8 and 20, the signals or potentials, which are alternatively connected to a first electrical pin 1, should be selected in such a manner that their voltage levels or current levels are disposed within an identical order of magnitude.

The invention is not restricted to the embodiments and variants of the invention presented. All combinations of the features claimed in the claims and/or of the features disclosed in the description and/or of the features illustrated in the drawings are also covered by the invention. For example, bipolar transistors can also be used instead of field-effect transistors.

The invention claimed is:

1. A semiconductor circuit comprising:
    at least one first electrical pin each of which is assigned alternatively multiple signals or multiple potentials, wherein each signal or each potential corresponds to a circuit variant integrated alternatively in the semiconductor circuit; and
    at least one switch element for isolating or connecting the at least one first electrical pin from or to an input or output of at least one functional unit integrated in the semiconductor circuit.

2. The semiconductor circuit according to claim 1, further comprising a selection unit for controlling the at least one switch element dependent upon a potential assignment of at least one second electrical pin of the semiconductor circuit.

3. The semiconductor circuit according to claim 1, wherein the at least one first electrical pin is connected, via a number of interconnected switch elements corresponding to the number of signal assignments or potential assignments of the at least one first electrical pin, to an input or output allocated to the first electrical pin of functional units associated respectively with the individual circuit variants.

4. The semiconductor circuit according to claim 1, wherein the input or output of the at least one functional unit, which is isolated in one circuit variant via a locked switching element from the at least one first electrical pin, is connected via another conductive switch element in each case to another electrical pin.

5. The semiconductor circuit according to claim 2, wherein the control of the at least one switch element is implemented in the selection unit dependent upon at least two potential levels connected to the second electrical pin.

6. The semiconductor circuit according to claim 2, wherein the control of the at least one switch element is implemented in the selection unit dependent upon at least two potential levels connected to several second electrical pins.

7. The semiconductor circuit according to claim 2, wherein the potential assignment connected to a second electrical pin is a supply voltage of the functional unit or a signal connected to an electrical pin is a release signal of the functional unit.

8. The semiconductor circuit according to claim 1, wherein the switch element is a transistor.

9. The semiconductor circuit according to claim 1, wherein the first electrical pin is a wire bridge to a pad connected to a housing of the semiconductor circuit with a reference potential of the semiconductor circuit.

10. The semiconductor circuit according to claim 9, wherein the pad is an exposed pad projecting beyond the housing of the semiconductor circuit with a ground potential of the semiconductor circuit.

11. The semiconductor circuit according to claim 8, wherein the transistor is a field-effect transistor.

* * * * *